United States Patent
Kim et al.

[11] Patent Number: 6,057,736
[45] Date of Patent: May 2, 2000

[54] GAIN CONTROLLED AMPLIFIER

[75] Inventors: Min Gun Kim; Chang Seok Lee; Jae Jin Lee; Kwang Eui Pyun, all of Daejeon, Rep. of Korea

[73] Assignee: Electronics and Telecommunications Research Institute, Daejon, Rep. of Korea

[21] Appl. No.: 09/135,576

[22] Filed: Aug. 18, 1998

[30] Foreign Application Priority Data

Nov. 25, 1997 [KR] Rep. of Korea ............ 97-62769

[51] Int. Cl.$^7$ .................... H03F 1/34; H03G 3/30
[52] U.S. Cl. ........................ 330/282; 330/294
[58] Field of Search ............... 330/282, 86, 278, 330/110, 285, 294

[56] References Cited

U.S. PATENT DOCUMENTS

| | | | |
|---|---|---|---|
| 4,379,995 | 4/1983 | Yamada et al. | 330/254 |
| 4,608,542 | 8/1986 | Siegel | 330/282 |
| 4,612,514 | 9/1986 | Shigaki et al. | 330/282 |
| 5,047,731 | 9/1991 | Lee | 330/282 |
| 5,264,806 | 11/1993 | Kobayashi | 330/294 |
| 5,363,064 | 11/1994 | Mikamura | 330/308 |
| 5,525,929 | 6/1996 | Nagahori et al. | 330/282 |
| 5,590,412 | 12/1996 | Sawai et al. | 330/282 |
| 5,661,437 | 8/1997 | Nishikawa et al. | 330/282 |

OTHER PUBLICATIONS

An MMIC Low–Distortion Variable–Gain Amplifier Using Active Feedback; Kenjiro Nishikawa and Tsuneo Tokumitsu; 1994; pp. 245–248.

A Linear Limiter: A 11–GHz Monolithic Low Distortion Variable Gain Amplifier; Masahiro Muraguchi and Masayoshi Aikawa; 1991; pp. 525–528.

*Primary Examiner*—Robert Pascal
*Assistant Examiner*—Khanh V. Nguyen
*Attorney, Agent, or Firm*—Antonelli, Terry, Stout & Kraus, LLP

[57] ABSTRACT

The present invention relates to a gain controlled amplifier, and more particularly, to a gain controlled amplifier using active feedback and variable resistance. It is an object of the present invention to provide a gain controlled amplifier minimizing the gain and the degradation of power characteristics generated when adjusting gain in a variable gain amplifier which receives signals having different power levels, amplifies them in accordance with each power level and outputs output signals in a constant power level. In order to achieve the above object, a gain controlled amplifier in accordance with the present invention comprises an amplifier and an active feedback means for negative feedbacking the output of the amplifier to the input of the amplifier, and further has a feedback amount controller inputting the controlled feedback signal to the amplifier by controlling the feedback amount of said active feedback means.

1 Claim, 3 Drawing Sheets

GAIN CONTROLLED AMPLIFIER

BACKGROUND OF THE INVENTION

1. Field of the Invention

The present invention relates to a gain controlled amplifier, and more particularly, to a gain controlled amplifier using active feedback and variable resistance.

2. Description of the Prior Art

In general, a variable gain amplifier is used to receive input signals having different power levels from each other, to amplify them in accordance with each power level and to send them as output signals having a constant power level. Among many methods to control gain, there is a method by which an attenuator is installed in the input or the output of an amplifier. However, it has problems as follows: if the attenuator is installed in the input, the noise characteristics get worse; if the attenuator is installed in the output, the output power characteristics are degraded; if the attenuator is installed between the input and the output, it imposes burden on the previous stage as the attenuation of the attenuator in terms of power characteristics.

A method which controls the bias of an amplifier has an advantage of controlling gain simply, but it has a problem that the power characteristics are degraded when condensing its consumption power to reduce gain. Though using a feedback circuit in amplifier in order to settle the problem, there is also a problem that the power and the matching characteristics are degraded since the load of the output of the amplifier is changed in accordance with the degrees of its feedback when using variable resistance in the feedback circuit. When using a common drain field effect transistor for the feedback circuit and controlling gains by using the gate bias of the field effect transistor, it is possible to prevent the degradation of the power characteristics by changing the load of output since the matching point is changed a little against the change of the gate bias and the isolation characteristics from the drain terminal to the gate terminal are excellent. However, since the power consumption should be provided properly to a common drain field effect transistor used for the power characteristics of signals feedbacked in that structure, the size of resistance value used for the bias of the source is restricted and, therefore, the gain of the amplifier is degraded because of the loss by the resistance.

FIG. 1 illustrates the circuit diagram of a variable gain amplifier using an active feedback according to the conventional art. As shown in FIG. 1, the circuit of the variable gain amplifier using the active feedback according to the conventional art is as follows:

Signals input to an signal input terminal 100 pass through an input matching circuit 101, are amplified in the first field effect transistor 104, pass through an output matching circuit 105 and are output to a signal output terminal 122. However, a part of signals output to the drain of the first field effect transistor 104 are transmitted into the gate of the second field effect transistor 111, are amplified in the second field effect transistor 111 in accordance with the gate bias point and are feedbacked to the gate of the first field effect transistor 104 through the source. At this time, since the phases of the original signal transmitted to the gate of the first field effect transistor 104 and the feedbacked signal transmitted through the second field effect transistor 111 are delayed 180°, the gain of the amplifier is reduced in proportion to an increase of the amount of signals transmitted by feedback. However, it is required to provide the power consumption properly to the drain common field effect transistor in order to prevent the degradation of power characteristics of the feedbacked signal in the power characteristics of the amplifier. Consequently, it generates problems that the size of the resistance value of a resistor used for the bias in the source of the common drain field effect transistor is limited and that the gain of the amplifier is degraded because of the loss by the resistance.

SUMMARY OF THE INVENTION

It is an object of the present invention to provide a gain controlled amplifier minimizing the gain and the degradation of power characteristics generated when adjusting gain in a variable gain amplifier which receives signals having different power levels, amplifies them in accordance with each power level and outputs output signals at a constant power level.

In order to achieve the above object, a gain controlled amplifier in accordance with the present invention comprises an amplifier and active feedback means for negative feedbacking the output of the amplifier to the input of the amplifier, and further has a feedback amount controller inputting the controlled feedback signal to the amplifier by controlling the feedback amount of the active feedback means. The feedback amount controller comprises a field effect transistor of controlling the resistance value between the source and the drain by using the voltage inputted the gate, and of controlling the feedback amount of the active feedback means by using the controlled resistance value.

BRIEF DESCRIPTION OF THE DRAWING

Still other advantages and features of the present invention will become apparent when the following detailed description is read in conjunction with the attached drawings, in which.

DETAILED DESCRIPTION OF THE PREFERRED EMBODIMENT

Figure 1:
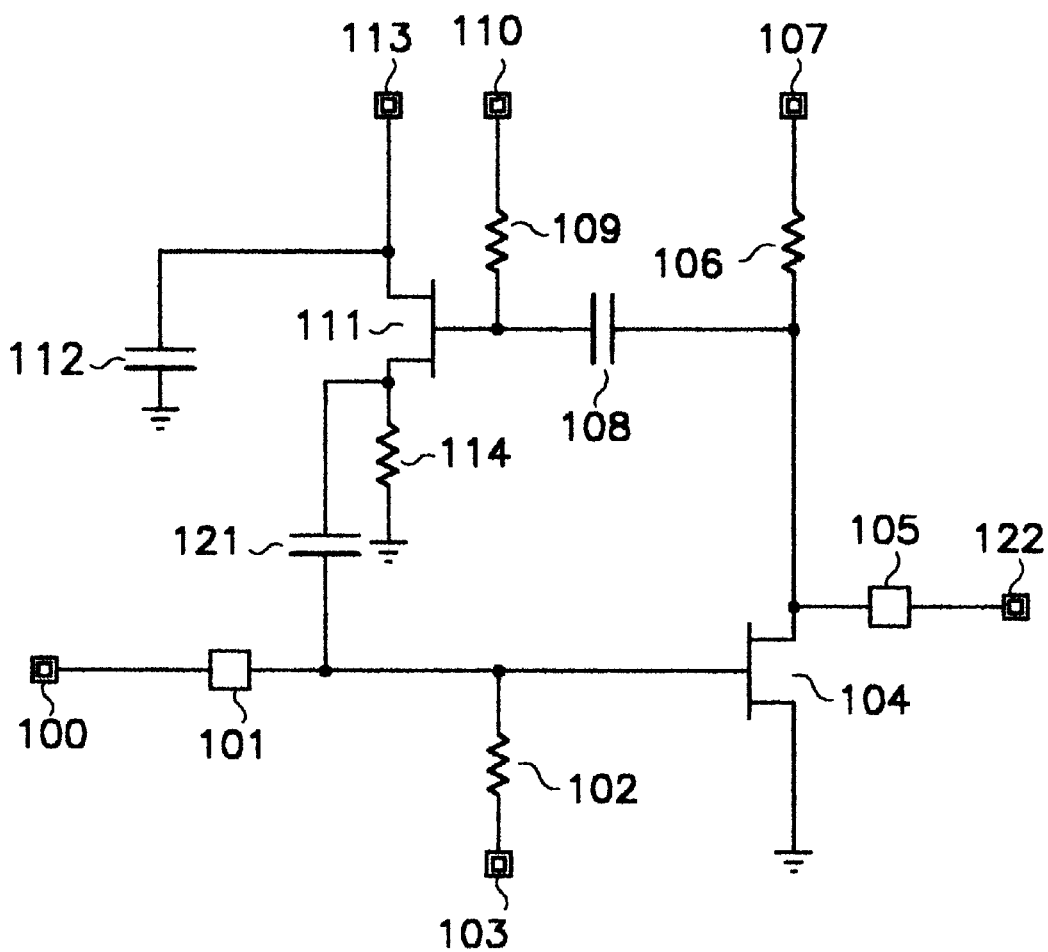
FIG. 1 illustrates a circuit diagram of a variable gain amplifier using an active feedback according to the conventional art.
Figure 2:
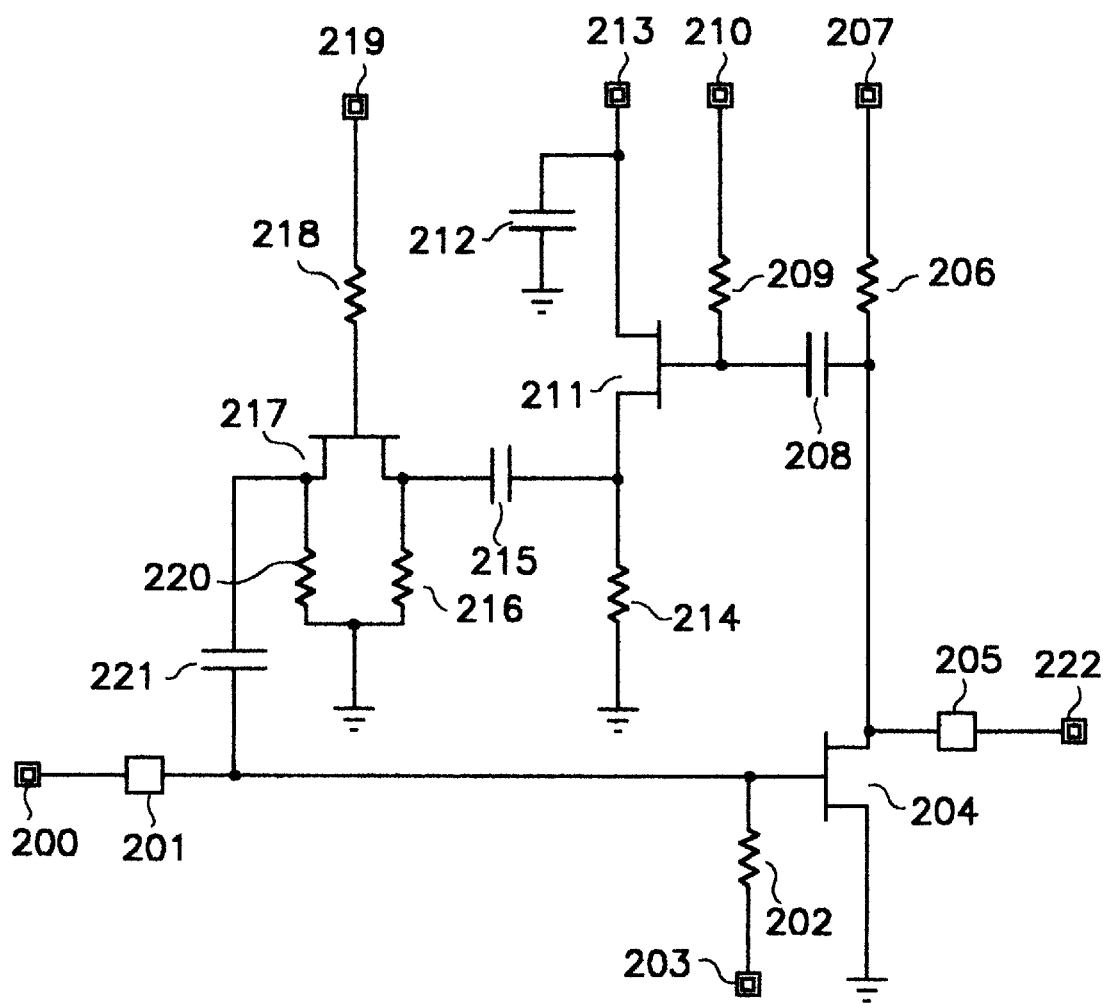
FIG. 2 illustrates a circuit diagram of a controlled gain amplifier using active feedback and variable resistance according to the present invention.

FIG. 2 illustrates a block diagram of a circuit according to the present invention. As shown in FIG. 2, signals input to a signal input terminal 200 are transmitted to the gate of the first field effect transistor 204 through an input matching circuit 201, are amplified in the first field effect transistor 204 and are output by signal output terminal 222 after passing through an output matching circuit 205. A part of signals output to the drain of the first field effect transistor 204 are transmitted to the second field effect transistor 211 through a condenser 208 and are amplified thereby. The amplified signals are transmitted to the third field effect transistor 217 which serves as a variable resistance of which resistance values are changed according to on-off switching of the channel between drain and source by a gain controlled bias 219. That is, the third field effect transistor 217 performs the function of a feedback amount controller. By this function, the amount of signals feedbacked from the drain of the first field effect transistor 204 to the gate of it are controlled and the gain of the amplifier is changed. Therefore, a gain controlled amplifier circuit using the variable resistance and the active feedback of the present invention keeps out the loss generated by the resistance of the source of the drain common field effect transistor of an feedback circuit by closing the channel of its variable resistance when a high gain is required, and, consequently, it prevents the degradation of the gain characteristics of the amplifier. Also, since the third field effect transistor 217 used as a variable resistance has a linear operating characteristics, the generated distortion of the feedback signal is of a small quantity.

Figure 3:
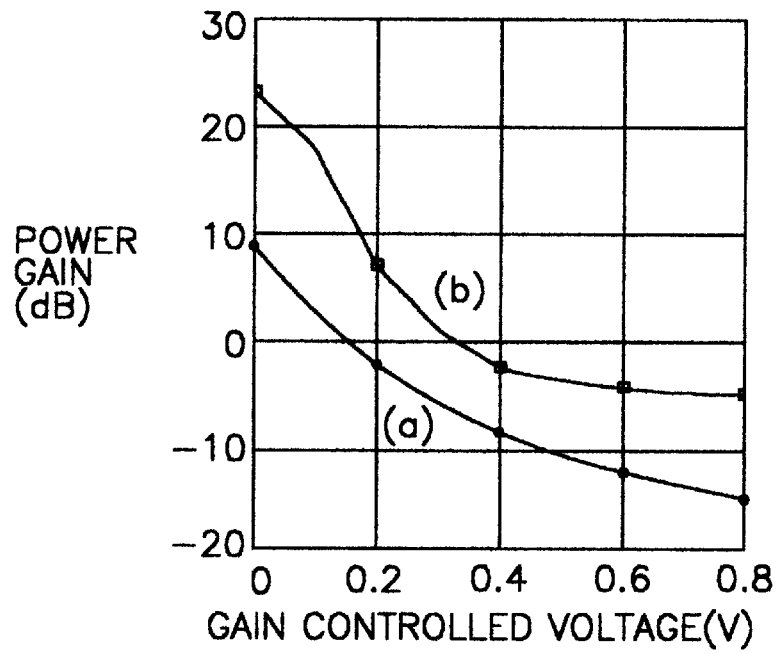
FIG. 3 illustrates a comparative table comparing gain characteristics between a variable gain amplifier using the conventional active feedback and a gain controlled amplifier using active feedback and variable resistance according to the present invention.

FIG. 3 illustrates a comparative table comparing gain characteristics between a variable gain amplifier using the conventional active feedback and a gain controlled amplifier using active feedback and variable resistance according to the present invention. In FIG. 3, the gain characteristics of a variable gain amplifier circuit using the conventional active feedback appears as–14.8~8.8 dB as (a), but the gain characteristics of a gain controlled amplifier circuit using the active feedback and the variable resistance of the present invention it–4.8~23.3 dB. Therefore, the gain characteristics of the circuit according to the present invention is larger by as much as 14.5 dB than the conventional circuit's and the range of the gain control is also larger by as much as 4.5 dB than the conventional circuit.

Figure 4:
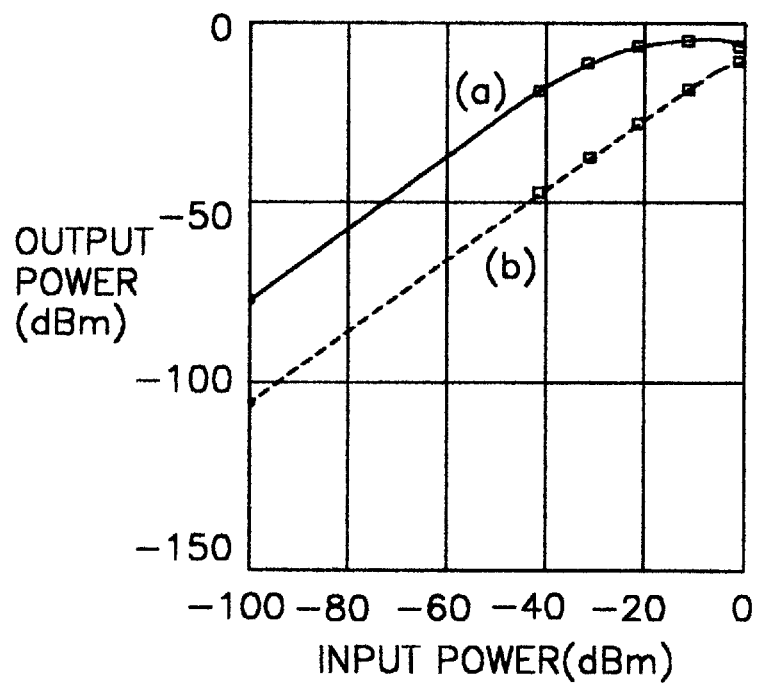
FIG. 4 illustrates a table of power characteristics between the maximum and minimum gains of active feedback and variable resistance according to the present invention.

FIG. 4 illustrates a table of power characteristics between the maximum and minimum gains of active feedback and variable resistance according to the present invention. As shown in FIG. 4, the power characteristics at the maximum gain of a gain controlled amplifier circuit using the active feedback and the variable resistance of the present invention is as the curve of (a) and the power characteristics at the minimum gain is as the curve of (b). Therefore, there is little degradation of power characteristics.

As described in the above, a gain controlled amplifier circuit of the present invention has the effects that the gain and the gain control thereof are considerably larger than the conventional circuit's, and that there is little degradation of power characteristics. It is to be understood that the above-described embodiments are merely illustrative of the principles of the invention, and that variations may be devised by those skilled in the art without departing from the spirit and scope of the invention. It is therefore intended that such variations be included within the scope of the claims.

What is claimed is:

1. A gain controlled amplifier, comprising:

an amplifier which amplifies an input signal; and feedback means for receiving an output signal of said amplifier and providing said received output signal of said amplifier to an input of said amplifier as a negative feedback signal;

wherein said amplifier includes a first field effect transistor (FET) having a common source connection and a drain and gate thereof are the output and input, respectively, of said amplifier; and wherein said feedback means includes:

a second FET having a common drain connection, the gate thereof receiving the output signal of said amplifier, and a third FET, the gate, the drain and source thereof being connected to, respectively, a gain control terminal, the source of said second FET and the input of said first FET.

* * * * *